US009496347B1

(12) United States Patent
Cheng et al.

(10) Patent No.: US 9,496,347 B1
(45) Date of Patent: Nov. 15, 2016

(54) GRADED BUFFER EPITAXY IN ASPECT RATIO TRAPPING

(71) Applicant: International Business Machines Corporation, Armonk, NY (US)

(72) Inventors: Cheng-Wei Cheng, White Plains, NY (US); Amlan Majumdar, White Plains, NY (US); Kuen-Ting Shiu, Yorktown Heights, NY (US); Jeng-Bang Yau, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/974,590

(22) Filed: Dec. 18, 2015

(51) Int. Cl.
*H01L 29/15* (2006.01)
*H01L 21/00* (2006.01)
*H01L 29/20* (2006.01)
*H01L 27/088* (2006.01)
*H01L 21/8234* (2006.01)

(52) U.S. Cl.
CPC ....... *H01L 29/20* (2013.01); *H01L 21/823412* (2013.01); *H01L 21/823431* (2013.01); *H01L 27/0886* (2013.01); *H01L 29/2003* (2013.01)

(58) Field of Classification Search
CPC ....... H01L 33/00; H01L 21/00; H01L 31/00; H01L 29/00; H01L 27/1203; H01L 21/76251; H01L 21/31053; H01L 21/02634; H01L 21/31111; H01L 21/02647
See application file for complete search history.

(56) References Cited

U.S. PATENT DOCUMENTS

| 8,324,660 B2 | 12/2012 | Lochtefeld et al. | |
|---|---|---|---|
| 2011/0049568 A1* | 3/2011 | Lochtefeld | H01L 21/02381 257/190 |
| 2013/0299885 A1* | 11/2013 | Zhu | H01L 29/66795 257/288 |
| 2014/0131770 A1* | 5/2014 | Chen | H01L 21/02381 257/192 |
| 2014/0264607 A1* | 9/2014 | Basu | H01L 29/785 257/365 |
| 2014/0357057 A1* | 12/2014 | Bao | H01L 21/02463 438/478 |

OTHER PUBLICATIONS

Bai et al., "Study of the defect elimination mechanisms in aspect ratio trapping Ge growth", Appl. Phys. Lett. 90, 101902 (2007), 4 pages.
Langdo et al., "High quality Ge on Si by epitaxial necking", Appl. Phys. Lett. 76, 3700 (2000), 4 pages.
Li et al., "Defect reduction of GaAs epitaxy on Si (001) using seletive aspect ratio trapping" Appl. Phys. Lett. 91, 021114 (2007), 4 pages.
Li et al., "Defect reduction of GaAs/Si epitaxy by aspect ratio trapping", J. Appl. Phys. 103, 106102 (2008), 4 pages.
Park et al., "Defect reduction of selective Ge epitaxy in trenches on Si(001) substrates using aspect ratio trapping", Appl. Phys. Let. 90, 052113 (2007), 4 pages.

* cited by examiner

*Primary Examiner* — Robert Bachner
*Assistant Examiner* — Moin Rahman
(74) *Attorney, Agent, or Firm* — Cantor Colburn LLP; Louis Percello

(57) ABSTRACT

A method of forming a semiconductor device includes: providing a patterned structure comprising a silicon substrate and dielectric stacks deposited on the silicon substrate, the dielectric stacks forming trenches exposing a plurality of surface portions of the substrate within the trenches; forming one or more epitaxial buffer layers within the trenches on the exposed surface portions of the substrate; and growing a semiconductor material on the epitaxial buffer layer that is the furthest away from the substrate; wherein each of the one or more epitaxial buffer layers and the semiconductor material has less than about 3% lattice mismatch to the layer immediately beneath the one or more epitaxial buffer layer and the semiconductor material.

20 Claims, 22 Drawing Sheets

US 9,496,347 B1

GRADED BUFFER EPITAXY IN ASPECT RATIO TRAPPING

BACKGROUND

The present disclosure relates to methods of integrating heteroepitaxy on silicon, and semiconductor devices formed using the methods.

Complementary metal oxide semiconductor technology makes use of both P and N channel devices in the same substrate material. CMOS technology is useful in the manufacture of many modern electronic devices. CMOS chips include microprocessors, microcontrollers, static RAM, and other digital logic circuits.

Traditionally, silicon is used as the semiconductor material in CMOS devices. To provide high speed channels, there are growing interests to adopt new materials other than silicon for the benefit of higher carrier mobility. Direct heteroepitaxy on silicon creates defective channel materials, which can lead to premature device failure and poor performance. Despite all the advances, there is a continuing need in the art to new methods that are effective to eliminate or reduce defects of heteroepitaxy growth on silicon.

SUMMARY

In an embodiment of the invention, a method of fabricating a semiconductor device is provided. The method includes: providing a patterned structure comprising a silicon substrate and dielectric stacks deposited on the silicon substrate, the dielectric stacks forming trenches exposing a plurality of surface portions of the substrate within the trenches; forming one or more epitaxial buffer layers within the trenches on the exposed surface portions of the substrate; and growing a semiconductor material on the epitaxial buffer layer that is the furthest away from the substrate; wherein each of the one or more epitaxial buffer layers and the semiconductor material has less than about 3% lattice mismatch to the layer immediately beneath the one or more epitaxial buffer layer and the semiconductor material.

In another embodiment of the invention, a method of fabricating a semiconductor device is provided. The method includes providing a patterned structure comprising a silicon substrate and dielectric stacks deposited on the silicon substrate, the dielectric stacks forming trenches exposing a plurality of surface portions of the substrate within the trenches; forming one or more epitaxial buffer layers within the trenches on the exposed surface portions of the substrate; growing a semiconductor material on the epitaxial buffer layer that is the furthest away from the substrate; each of the one or more epitaxial buffer layers and the semiconductor material having less than about 3% lattice mismatch to the layer immediately beneath the one or more epitaxial buffer layer and the semiconductor material; forming a fin on the substrate; forming a sacrificial gate stack over the fin; forming source/drain regions on the fin; depositing an insulator layer over the source/drain region, on the dielectric stacks, and adjacent to the sacrificial gate stack; removing the sacrificial gate stack to define a cavity; depositing a high-k dielectric layer in the cavity; and forming a metal gate in the cavity.

In yet another embodiment of the invention, a semiconductor device is provided. The device includes a silicon substrate; dielectric stacks deposited on the silicon substrate, the dielectric stacks forming trenches exposing a plurality of surface portions of the substrate within the trenches; one or more epitaxial buffer layers deposited on the exposed surface portions of the substrate within the trenches; and a semiconductor layer deposited on the epitaxial buffer layer that is the furthest away from the substrate; wherein each of the one or more epitaxial buffer layers and the semiconductor layer has less than about 3% lattice mismatch to the layer immediately beneath the one or more epitaxial buffer layer and the semiconductor layer.

BRIEF DESCRIPTION OF THE DRAWINGS

The following descriptions should not be considered limiting in any way. With reference to the accompanying drawings, like elements are numbered alike.

DETAILED DESCRIPTION

For heteroepitaxial layers grown beyond a certain thickness, misfit dislocations can be formed at the interface of the substrate and heteroepitaxial layers as threading dislocations. Heteroepitaxy on aspect ratio trapping (ART) structure has been used to reduce threading dislocation density. However, it can be difficult to achieve low stacking faults and low grain-boundary density via ART technology. Stacking faults are planar defects that characterize the disordering of crystallographic planes. A grain boundary is the interface between two grains. Grain boundaries are defects in crystal structures and can decrease the electrical and thermal conductivity of the material.

Methods and devices are provided that are effective to reduce stacking faults and gran-boundary density in addition to reducing threading dislocation density. Instead of depositing final semiconductor material directly on a silicon substrate, one or more buffer layers are deposited between a silicon substrate and a final semiconductor material, each of the one or more buffer layers and the final semiconductor material has less than about 3% or less than about 2.5% lattice mismatch to the layer directly underneath. Without wishing to be bound by theory, it is believed that when the adjacent layers have less than about 3% or less than about 2.5% lattice mismatch, each buffer layer can be relaxed. Thus, there will be no strain to induce stacking faults and grain-boundary in the final semiconductor layer. In addition, the one or more buffer layers and the final semiconductor material are deposited between trenches formed by dielectric stacks having selected aspect ratios. Thus, the defects caused by lattice mismatch such as threading dislocation density can be further reduced by aspect ratio trapping.

Figure 1:
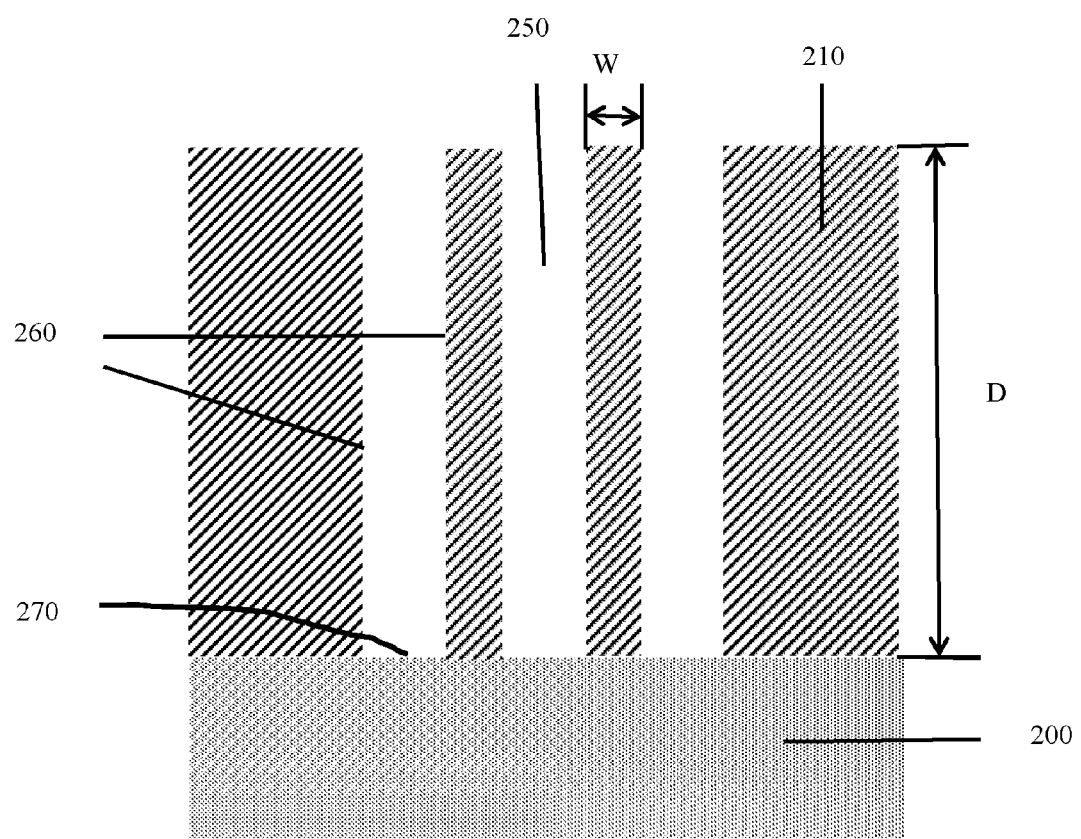
FIG. 1 is a cross-sectional view of a patterned structure comprising a silicon substrate and dielectric stacks disposed on the silicon substrate.

Turning now to the Figures, FIG. 1 is a cross-sectional view of a patterned structure comprising a silicon substrate 200 and dielectric stacks 210 disposed on the silicon substrate 200. The dielectric stacks 210 form trenches 250. The trenches contain sidewalls 260 and exposed surface portions 270 of substrate 200.

The silicon substrate 200 includes monocrystalline Si, SiGe, SiC, and semiconductor-on-insulator (SOI). Before further processing, the substrate can be baked to remove native oxide and other impurities. The baking process may optionally include a reactive gas such as $AsH_3$ or other reactive gases depending on the impurities that are to be reduced or eliminated. Alternatively or in addition, a wet etch or other chemical treatment may be employed to clean the substrate.

Dielectric materials for the dielectric stacks 220 include, for example, an oxide, a nitride, an oxynitride, or any combination thereof. Other mask materials such as BN can also be used. Examples of oxide include $SiO_x$, and $AlO_x$ etc.

Methods of forming the patterned structure illustrated in FIG. 1 are not particularly limited. In an embodiment, the method includes providing a silicon substrate having a dielectric layer on a surface of the substrate; and forming trenches within the dielectric layer to expose a plurality of surface portions of the substrate within the trenches to provide the pattern structure. Photolithographic techniques known to those skilled in the art followed by etching may be employed to form the trenches. If the dielectric layer is formed from silicon dioxide, hydrogen fluoride is among the materials that may be employed for such etching.

The thickness of the dielectric layer corresponds to the depths of the trenches ("D"). The patterning of the dielectric layer is designed to provide trench widths or diameters ("W") having specific dimensions. The ratio of the depth to the width of the trenches is known as the aspect ratio. The selection of an appropriate aspect ratio contributes to the formation of epitaxial structures within the trenches that have portions that are substantially free of defects associated with threading dislocations. The trenches 250 have uniform depths and widths in some embodiments, which correspond to an aspect ratio of 1.0 to 10.0 or 2.0 to 3.5.

Figure 2:
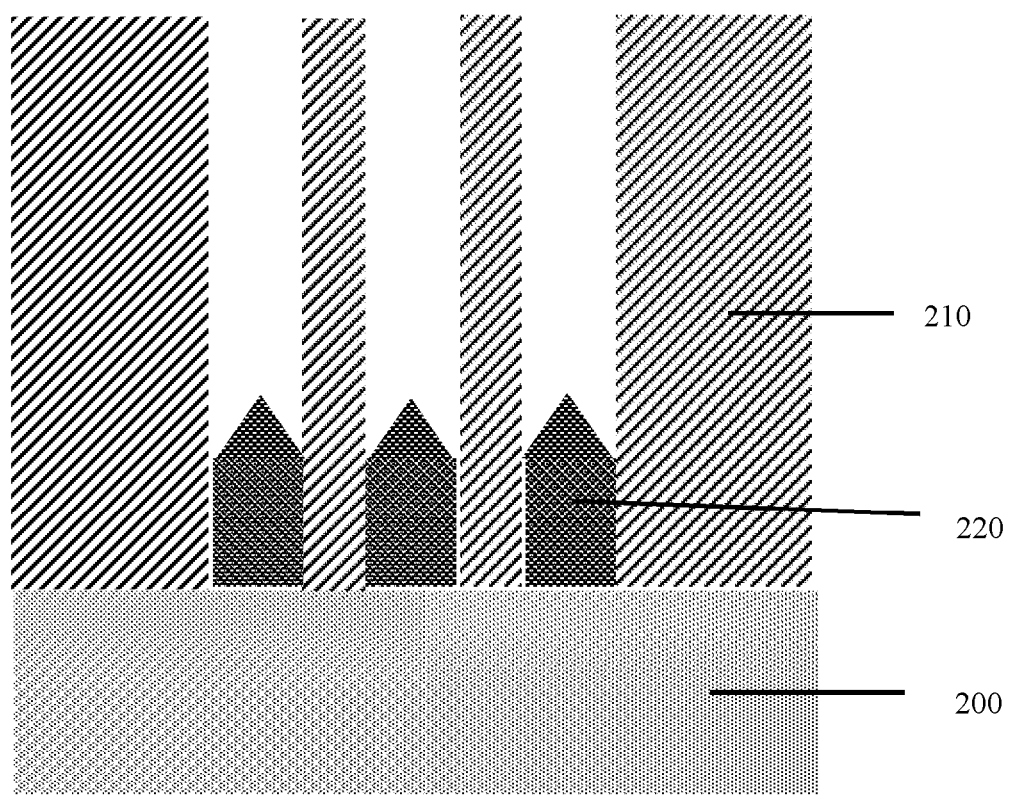
FIG. 2 is a cross-sectional view after depositing a first buffer layer directly on the silicon substrate between the dielectric stacks.
Figure 3:
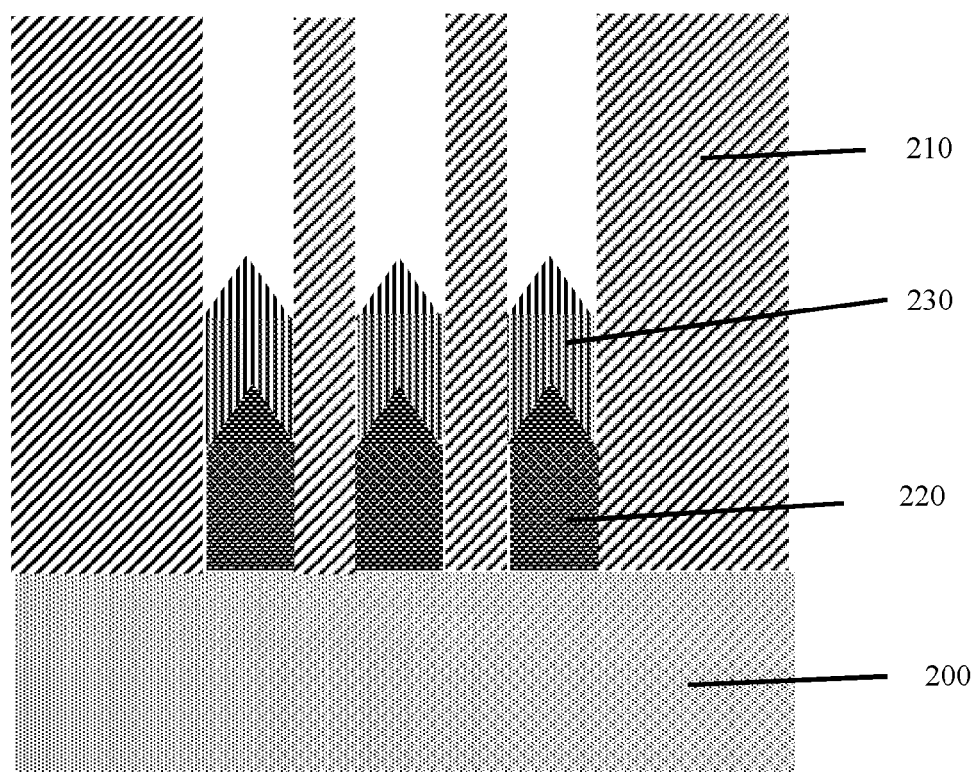
FIG. 3 is a cross-sectional view after depositing a second buffer layer on the first buffer layer.

FIG. 2 is a cross-sectional view after depositing a first epitaxial buffer layer 220 directly on the silicon substrate 200 between the dielectric stacks 210. FIG. 3 is a cross-sectional view after depositing a second epitaxial buffer layer 230 on the first epitaxial buffer layer 220.

The buffer layers are grown using an epitaxial growth process. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. In an embodiment, the buffer layers are formed using atomic layer deposition or chemical vapor deposition.

Although FIGS. 2 and 3 illustrate the deposition of two epitaxial buffer layers, it is understood that depending on the lattice mismatch between the silicon substrate and the final semiconductor material, there can be only one buffer layer or more than two buffer layers present as long as each of the one or more epitaxial buffer layers and the final semiconductor material has less than about 3%, less than about 2.5%, or about 2% or less lattice mismatch to the layer immediately beneath the one or more epitaxial buffer layers and the semiconductor material. When such lattice mismatch is satisfied, it is believed that each buffer layer can be relaxed. Thus, there will be no strain to induce stacking faults and grain-boundary in the final semiconductor layer. To determine the number of buffer layers necessary, one can measure the lattice constant of the silicon substrate and the final semiconductor material and follow the principle that each epitaxial buffer layers and final semiconductor material has a lattice mismatch of less than about 3% or less than about 2.5% than the layer immediate underneath.

As used herein, assuming that a given epitaxial buffer layer or the final semiconductor material has a first lattice constant and the layer immediately beneath the given epitaxial buffer layer or the final semiconductor material has a second lattice constant, the lattice mismatch can be calculated by dividing the difference of the first lattice constant and the second lattice constant with the second lattice constant.

In the specific example illustrated in FIGS. 2 and 3, the material for the first epitaxial buffer layer 220 comprises AlAs, GaAs, AlP, GaP, or combinations thereof. The second buffer layer 230 can comprise a material having a fixed composition. For example, the second buffer layer 230 can contain $In_xAl_{1-x}As$ or $In_xGa_{1-x}As$, wherein x is fixed having a value between about 0.1 and about 0.7. Alternatively, the second epitaxial buffer layer can include a material having a graded composition. The grade composition contains two or more materials where the materials have a different ratio at the top and bottom surfaces of the buffer layer. The gradient can be achieved stepwise or continuously (linear change). In an embodiment, the grade composition includes $In_xAl_{1-x}As$, wherein x is about 0.1 to about 0.7 and increases from the first buffer layer to the final semiconductor material. In another embodiment, the grade composition includes $In_xGa_{1-x}As$, wherein x is 0 to about 0.5 and increases from the first buffer layer to the final semiconductor material.

Each epitaxial buffer layer can have a thickness of about 1 nm to about 200 nm or about 50 nm to about 100 nm. The total thickness of the one or more epitaxial buffer layers is about 10 nm to about 500 nm or about 50 nm to about 350 nm.

Upon formation of the one or more epitaxial buffer layers, another bake process may be employed to prepare the buffer layer to receive a final semiconductor material.

Figure 4:
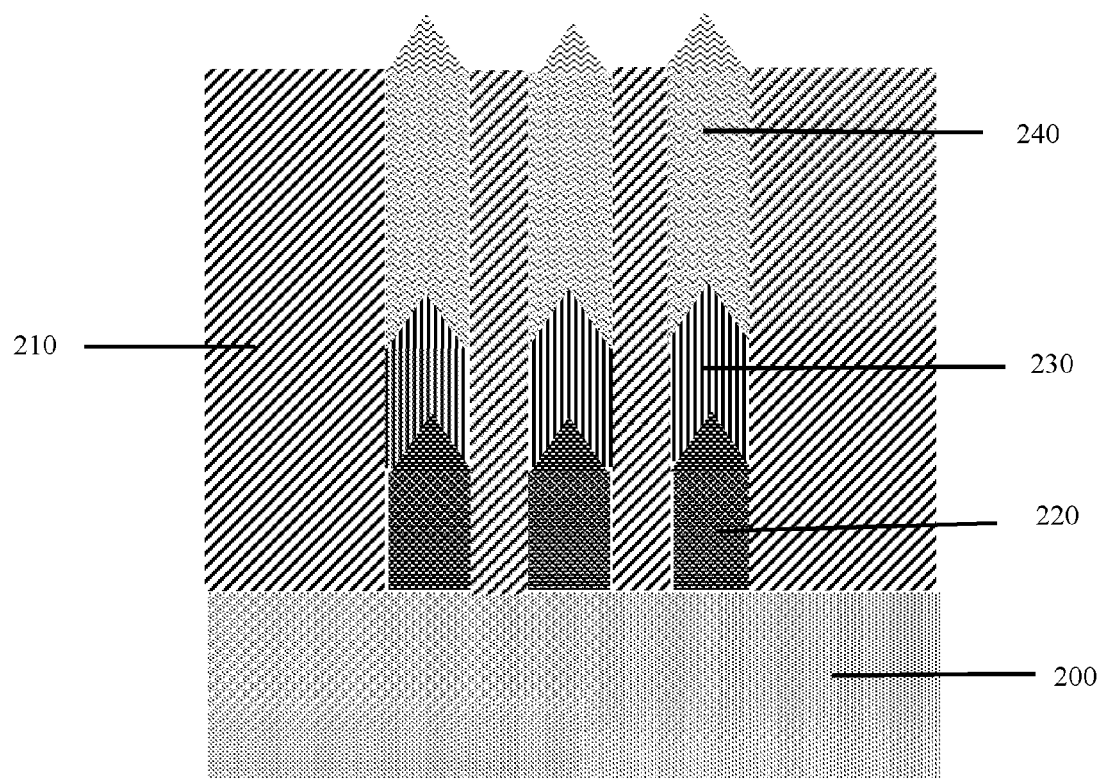
FIG. 4 is a cross-sectional view after growing a semiconductor material on the second buffer layer.

FIG. 4 is a cross-sectional view after growing a semiconductor material 240 on the second buffer layer 230. An epitaxial growth process is employed to grow the semiconductor material. In an embodiment, the final semiconductor material includes a III-V material. Suitable III-V materials include, e.g., InGaAs such as $In_xGa_{1-x}As$ where x is about 0.5 to about 0.75, InP, GaAs, GaN, GaP, GaSb, AlP, AlN, etc. The III-V material has a monocrystalline structure. The structure shown in FIG. 4 can be further processed for forming transistors or any other electronic device.

Figure 5:
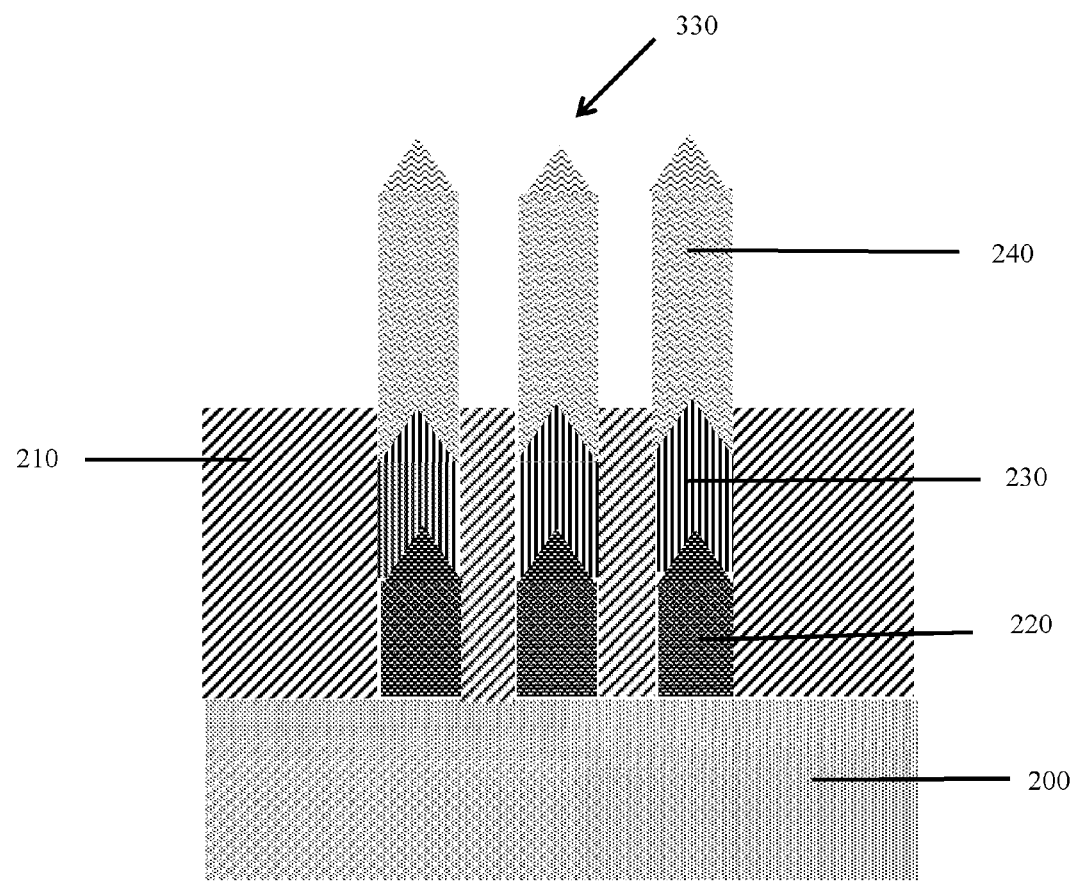
FIG. 5 is a cross-sectional view following the formation of fins after etching the dielectric stacks.
Figure 6:
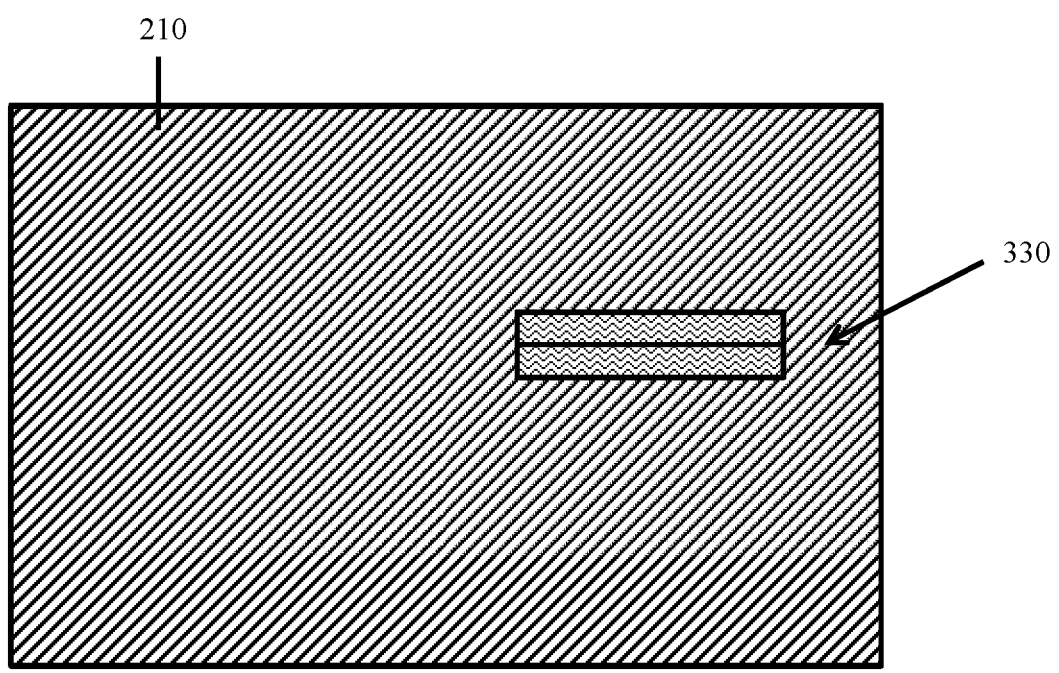
FIG. 6 is a top view following the formation of fins, where only one fin in FIG. 5 is shown for simplicity.

FIG. 5 illustrates a cross-sectional view following the formation of fins 330. Fins 330 are formed from the final semiconductor material 240. For simplicity, only one fin is shown in the subsequent figures. FIG. 6 is a top view showing fin 330. The fins can be formed by etching dielectric stacks 210.

Figure 7:
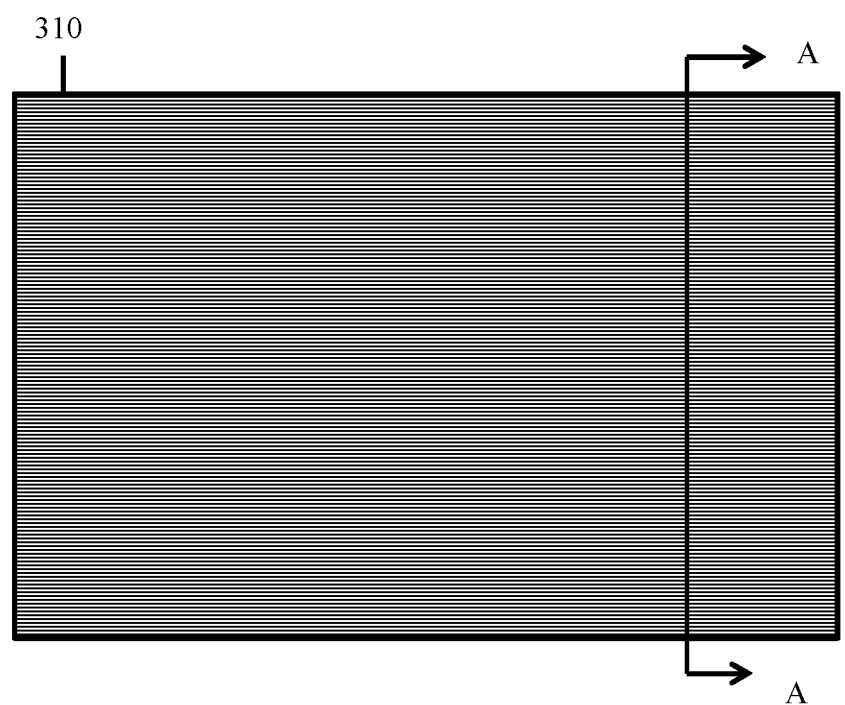
FIG. 7 illustrates a top view of the resultant structure following the deposition of a layer of sacrificial gate material (of FIG. 8) and a hardmask layer over the sacrificial gate material.
Figure 8:
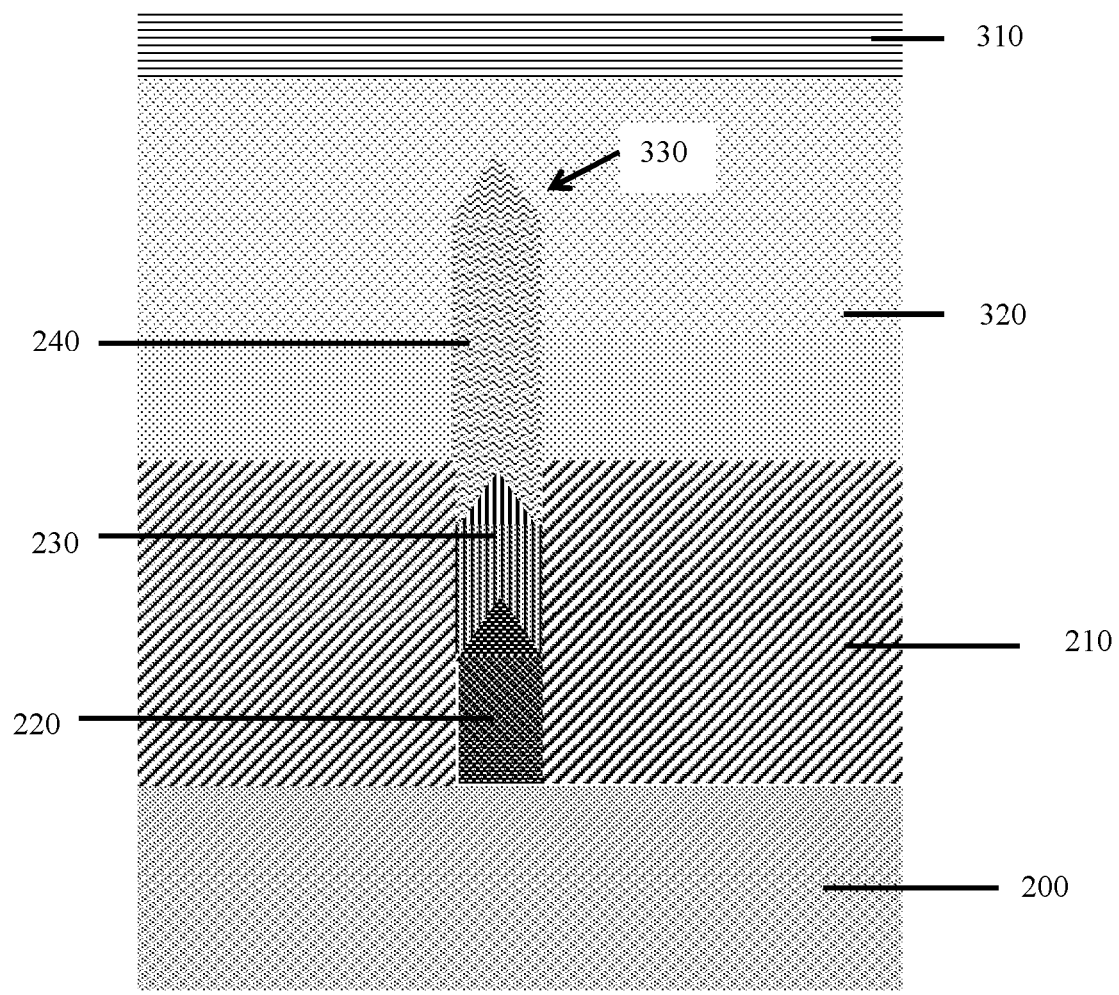
FIG. 8 illustrates a cutaway view along the line A-A of FIG. 7.

FIG. 7 illustrates a top view of the resultant structure following the deposition of a layer of sacrificial gate material 320 (of FIG. 8) and a hardmask layer 310 over the sacrificial gate material 320. FIG. 8 illustrates a cutaway view along the line A-A of FIG. 7. The sacrificial gate material 320 may include, for example, a polysilicon material. Non-limiting examples of suitable materials for the hard mask layer 310 include silicon oxide, silicon nitride, or any combination thereof. The thickness of the hard mask layer 310 is not intended to be limited.

Figure 9:
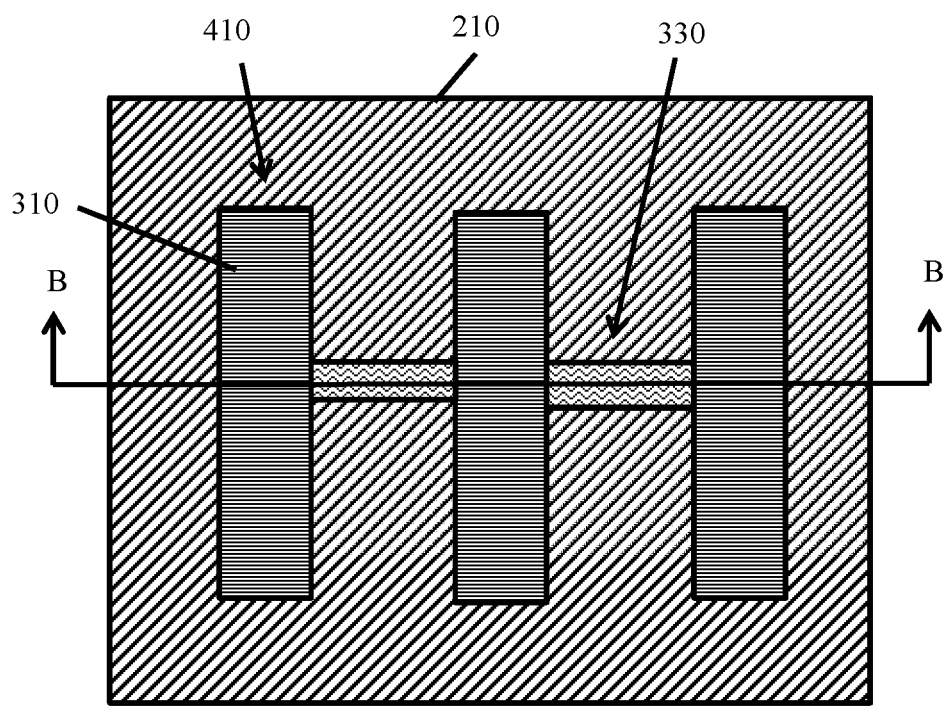
FIG. 9 illustrates a top view following the formation of sacrificial gate stacks after patterning and etching hardmask material and the sacrificial material.
Figure 10:
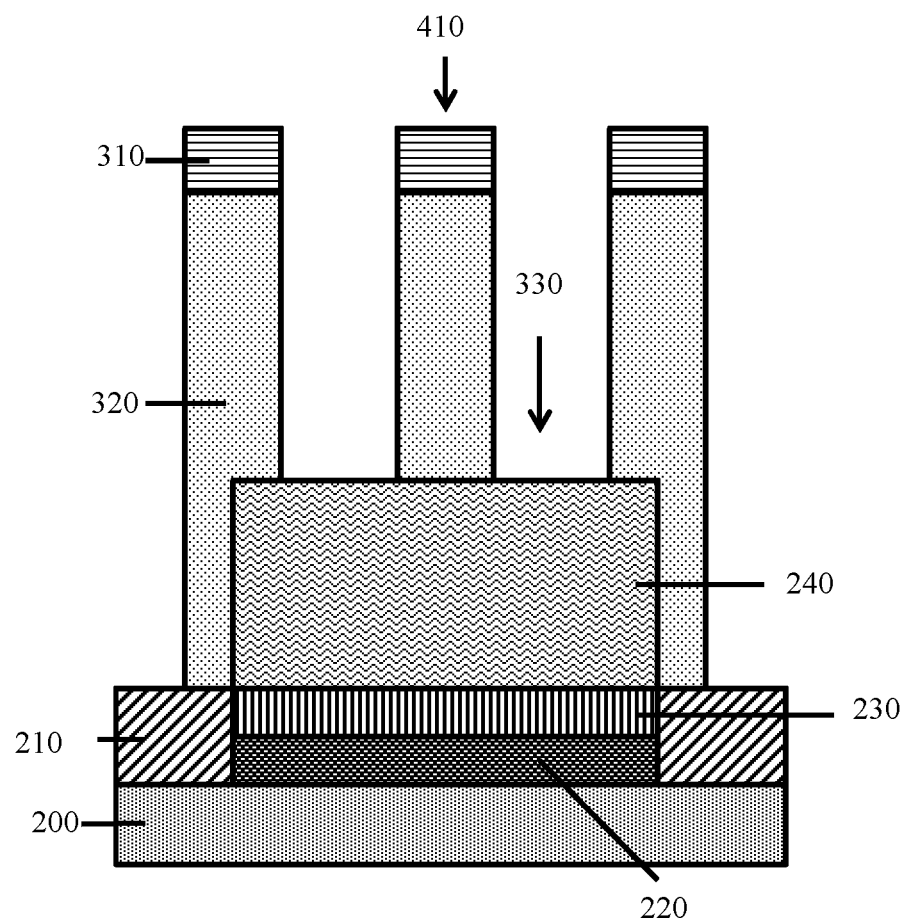
FIG. 10 illustrates a cutaway view along the line B-B of FIG. 9 showing the formation of sacrificial gate stacks.

FIG. 9 illustrates a top view following the patterning and etching of hardmask material and the sacrificial material to form sacrificial gate stacks 410. FIG. 10 illustrates a cutaway view along the line B-B of FIG. 9. The sacrificial gate stacks 410 are arranged over both the fin 330 and portions of the dielectric stacks 210 that do not include the fin. Depending on the final structure the device, optionally, the sacrificial gate stacks 410 are arranged such that some sacrificial gate stacks are arranged over the fin 330 define channel regions of the fin 330, while other sacrificial gate stacks are not arranged over the fin 330.

Figure 11:
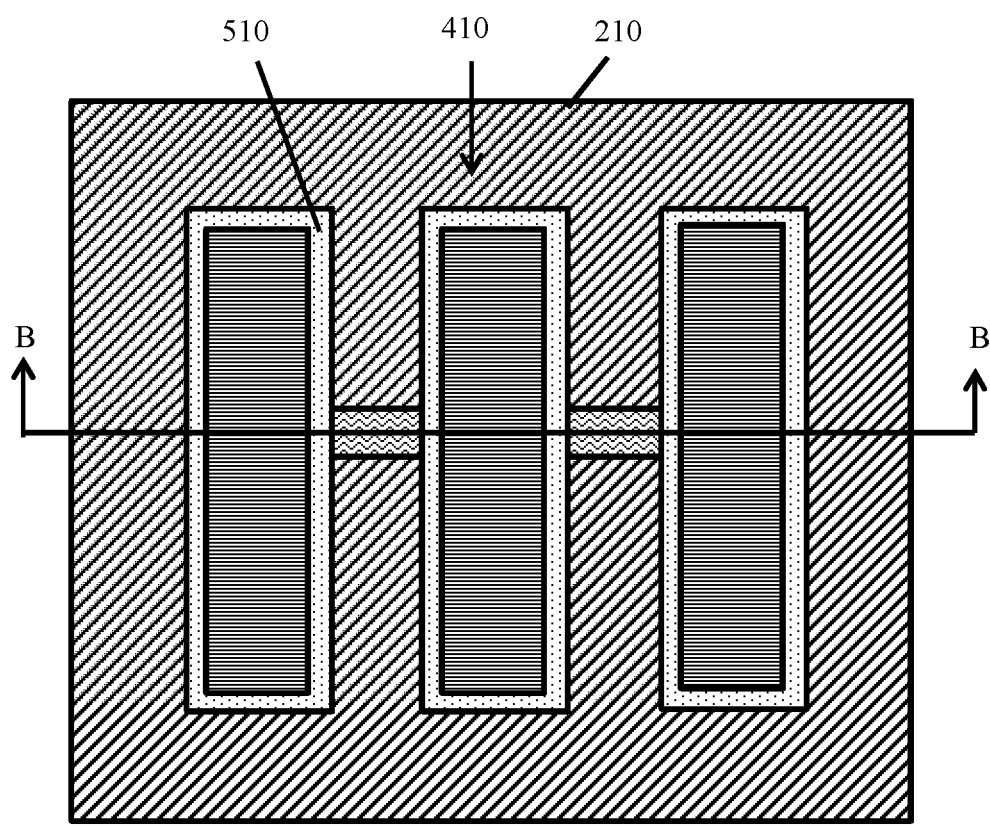
FIG. 11 illustrates a top view of the resultant structure following the formation of spacers along the sidewalls of the sacrificial gate stacks.
Figure 12:
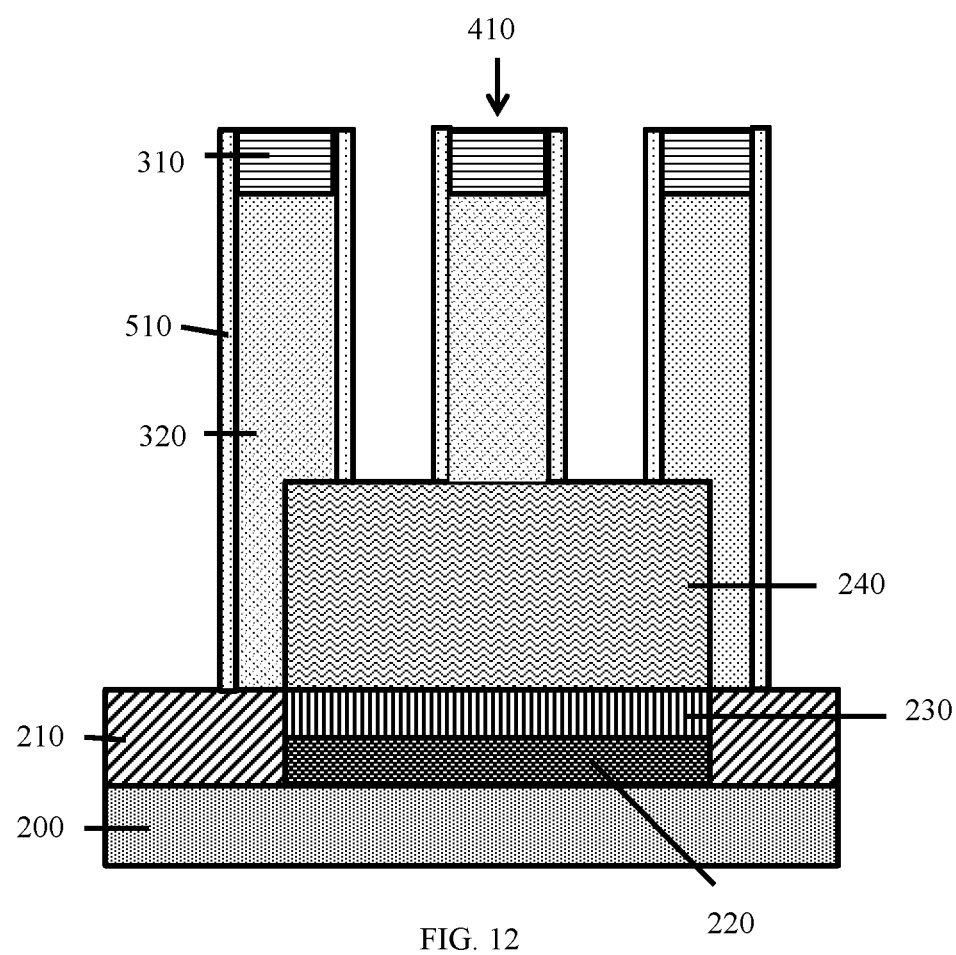
FIG. 12 illustrate a cutaway view along the line B-B of FIG. 11 showing the spacer.

FIG. 11 illustrates a top view of the resultant structure following the formation of spacers 510 along the sidewalls of the sacrificial gate stacks 410. FIG. 12 illustrates a cutaway view along the line B-B of FIG. 11 showing the spacer.

The spacers 510 are formed from a low-k spacer material. The low-k spacer material may contain Si, N, and at least one element selected from the group consisting of C and B. Additionally, the low-k spacer material may contain Si, N, B, and C. For example, the low-k spacer material may include SiBN, SiCN, SiBCN, or any combination thereof. The spacers 510 are formed by depositing a layer of the low-k spacer material and performing an anisotropic etching process such as, for example, reactive ion etching that forms the resultant spacers 510. It is appreciated that spacers 510 are optional. For example, if the subsequent sour/drain epitaxy does not cause any nucleation on the sidewalls of the sacrificial gate stack 410, such spacers are not necessary.

Figure 13:
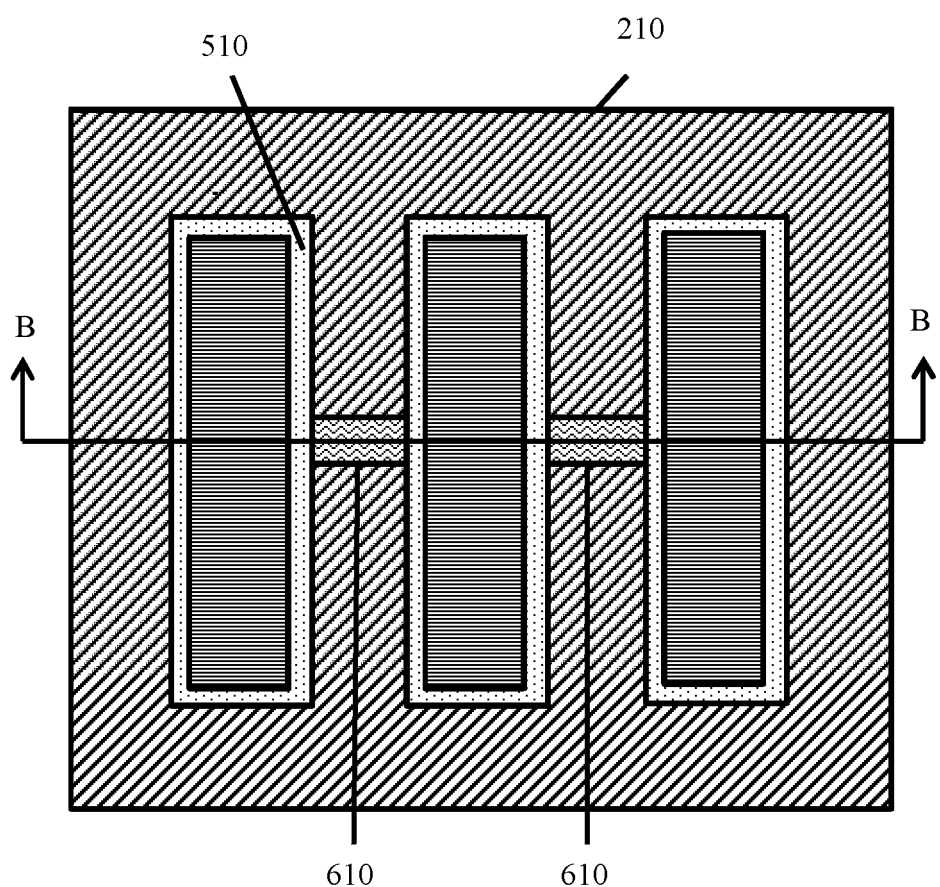
FIG. 13 illustrates a top view following the formation of source/drain regions.
Figure 14:
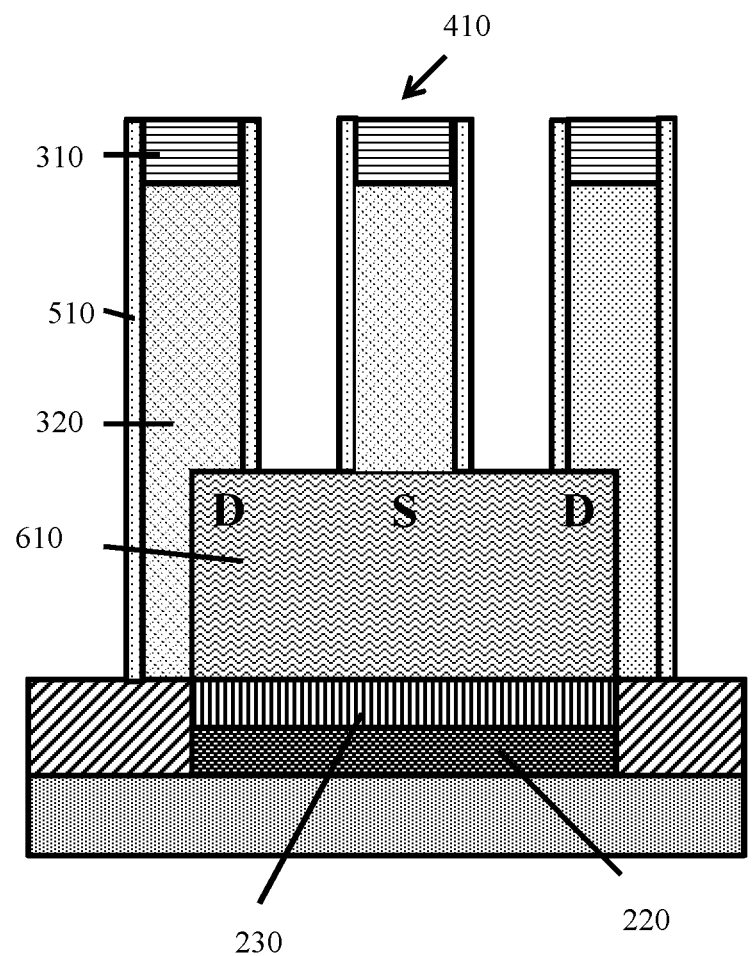
FIG. 14 illustrates a cutaway view along the line B-B of FIG. 13 showing the source/drain regions.

FIG. 13 illustrates a top view following the formation of source/drain regions 610. The source/drain regions may be formed by, for example, an ion implantation and annealing process that implants dopants in the exposed regions of the fins. In an alternate exemplary embodiment, the source/drain regions may be formed by, for example, an epitaxial growth process. An epitaxial growth process deposits a crystalline layer onto a crystalline substrate beneath. The underlying substrate acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of transistor during the epitaxial growth process. Alternatively, the epitaxial material may be doped using ion implantation following the epitaxial growth process. FIG. 14 illustrates a cutaway view along the line B-B of FIG. 13 showing the source/drain region 610.

Figure 15:
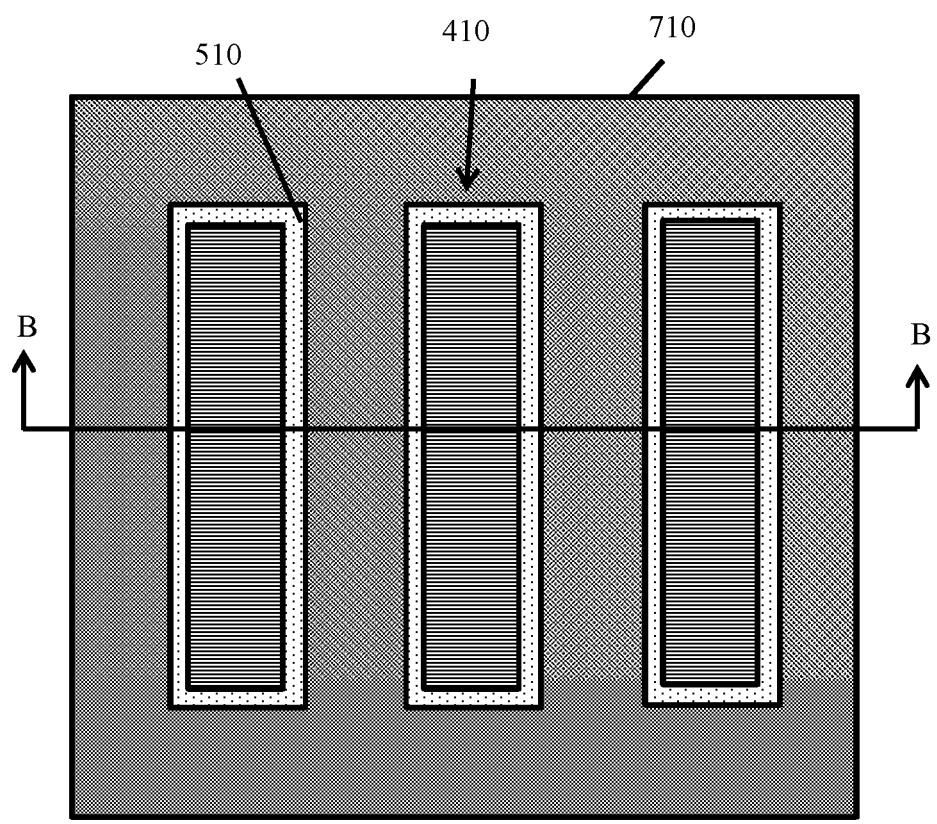
FIG. 15 illustrates a top view following the formation of an insulator layer over portions of the fin and the dielectric stacks.
Figure 16:
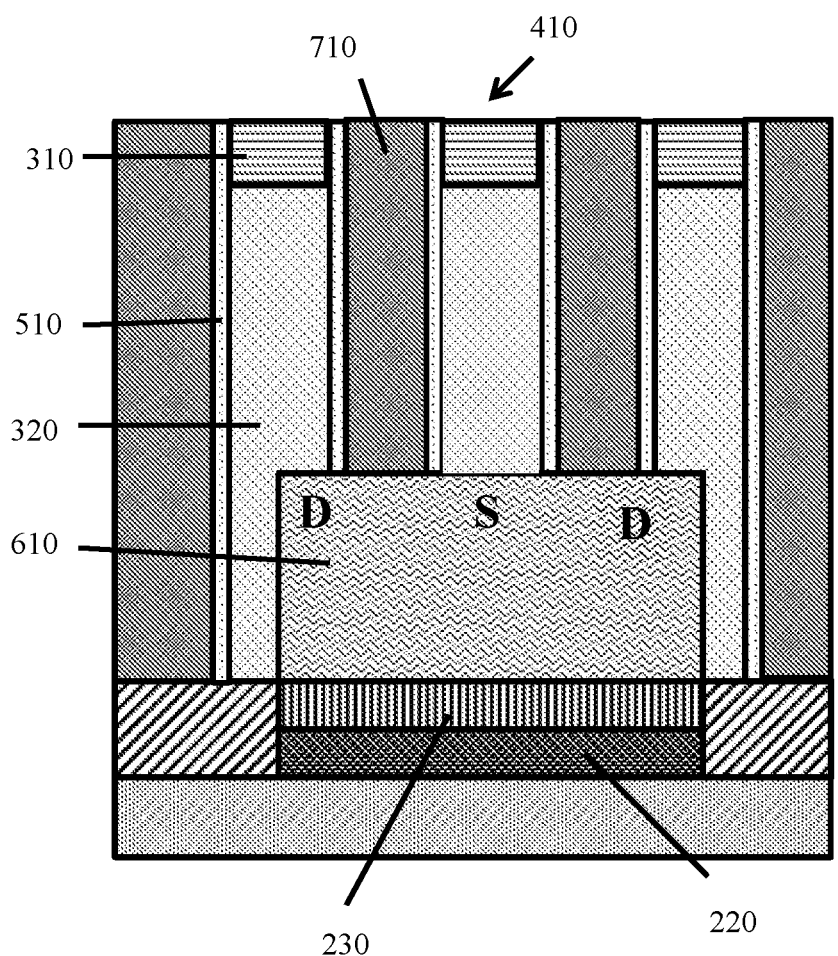
FIG. 16 illustrates a cutaway view along the line B-B of FIG. 15 showing the insulator layer.

FIG. 15 illustrates a top view following the formation of an insulator layer 710 over portions of the fin 330 and the dielectric stack 210. The insulator layer 710 includes, for example, an oxide material. Non-limiting examples of suitable oxide materials include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, or any combination thereof. Following the deposition of the insulator layer 710 a planarization process such as, for example, chemical mechanical polishing (CMP) may be performed. FIG. 16 illustrates a cutaway view along the line B-B of FIG. 15 showing the insulator layer 710.

Figure 17:
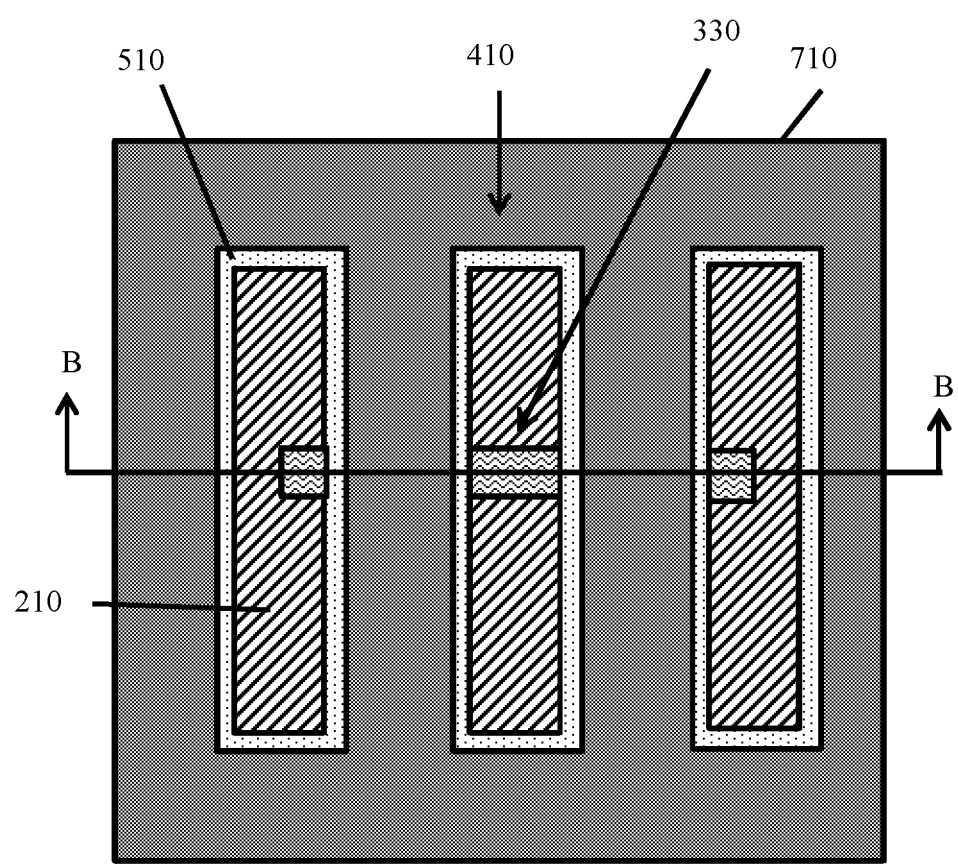
FIG. 17 illustrates a top view of the resultant structure following the removal of the sacrificial gate stacks by removing the hardmask layer and the sacrificial gate material.
Figure 18:
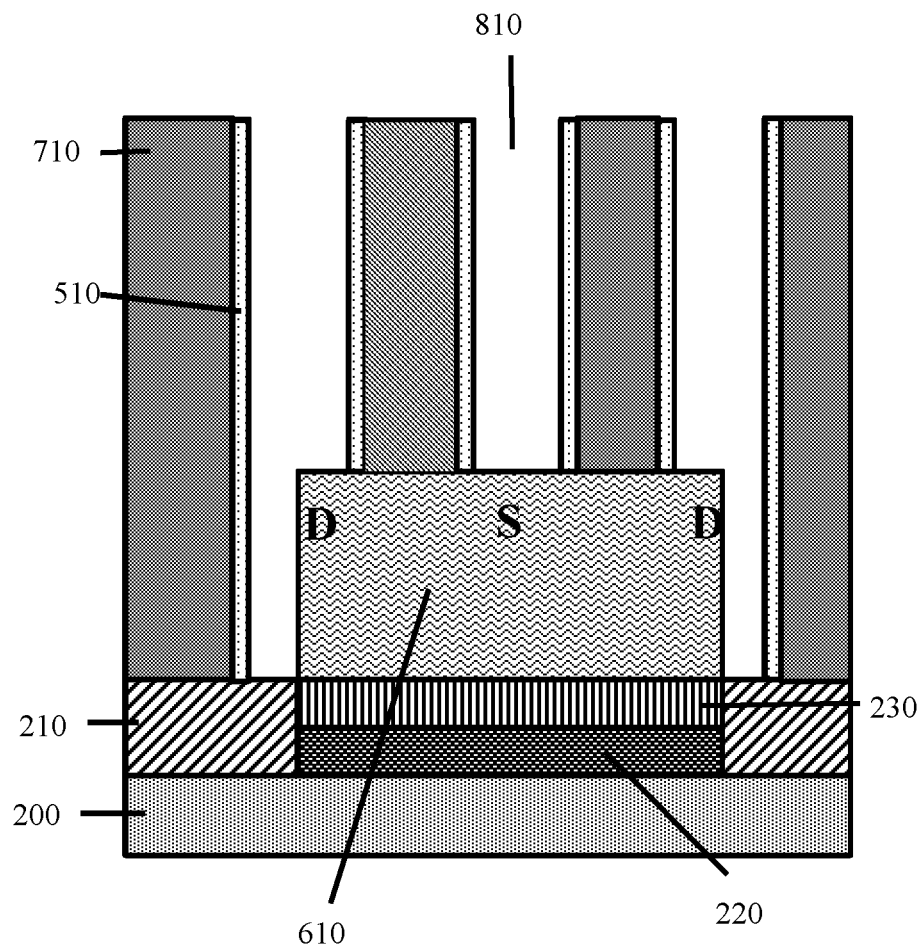
FIG. 18 illustrates a cutaway view along the line B-B of FIG. 17 showing the cavities.

FIG. 17 illustrates a top view of the resultant structure following the removal of the sacrificial gate stacks 410 by removing the hardmask layer 310 and the sacrificial gate material 320 using a suitable etching process. The removal of the sacrificial gate stacks forms cavities 810 that are partially defined by the dielectric stacks 210 and the spacers 510. FIG. 18 illustrates a cutaway view along the line B-B of FIG. 17 showing the cavities 810.

Figure 19:
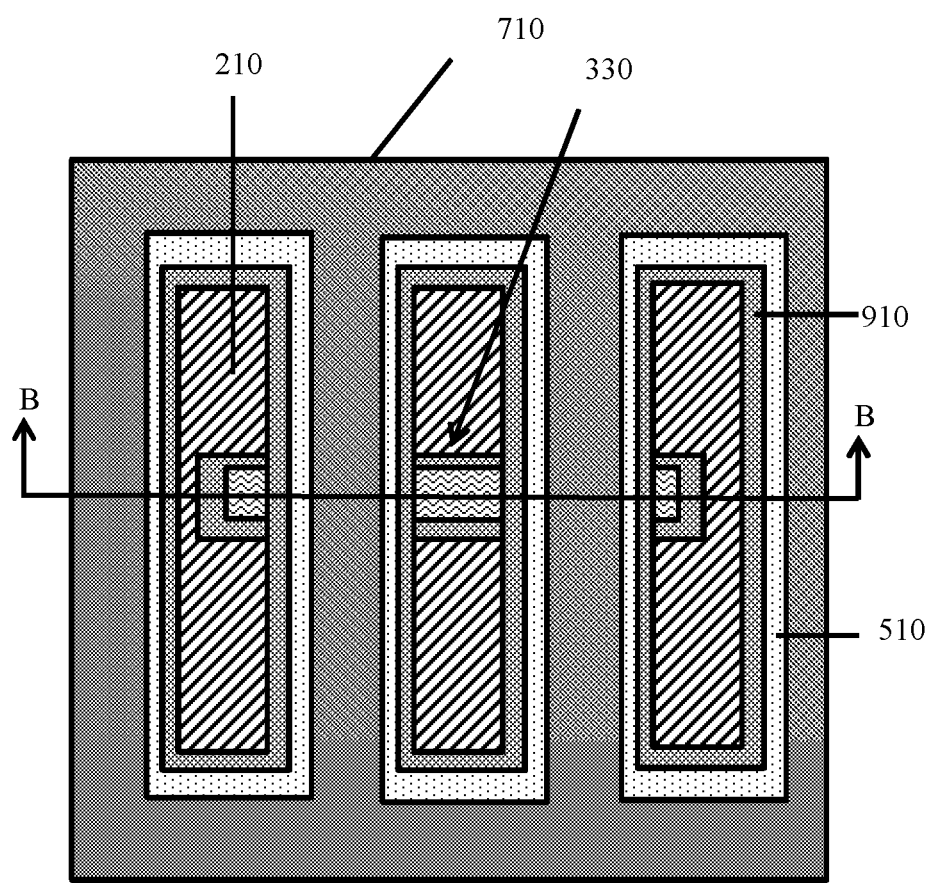
FIG. 19 illustrates a top view following the formation of a high-k dielectric layer in the cavities.

FIG. 19 illustrates a top view following the formation of a high-k dielectric layer 910 in the cavities 810. The high-k dielectric material(s) can be a dielectric material having a dielectric constant greater than 4.0, 7.0, or 10.0. High-k dielectric materials include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

Figure 20:
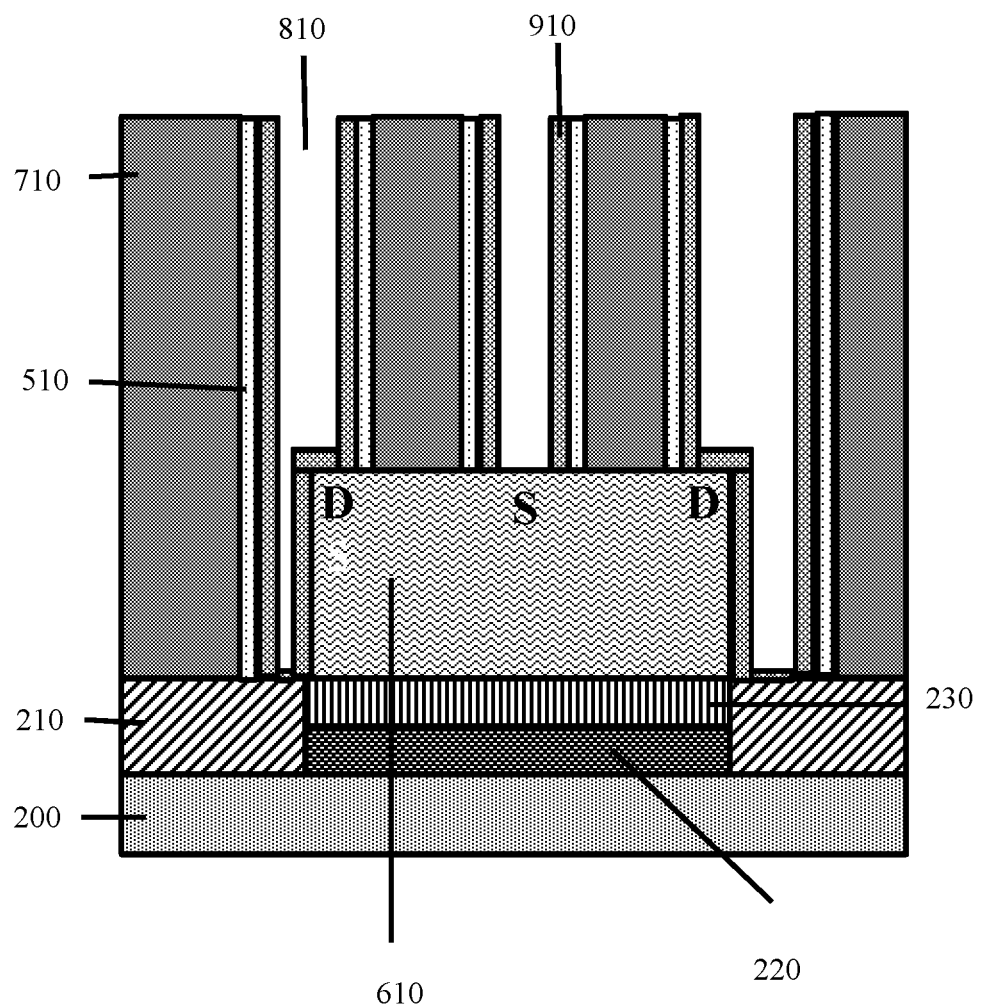
FIG. 20 illustrates a cutaway view along the line B-B of FIG. 19 showing the high-k dielectric layer in the cavities.

FIG. 20 illustrates a cutaway view along the line B-B of FIG. 19 showing the high-k dielectric layer 910 in the cavities 810.

Figure 21:
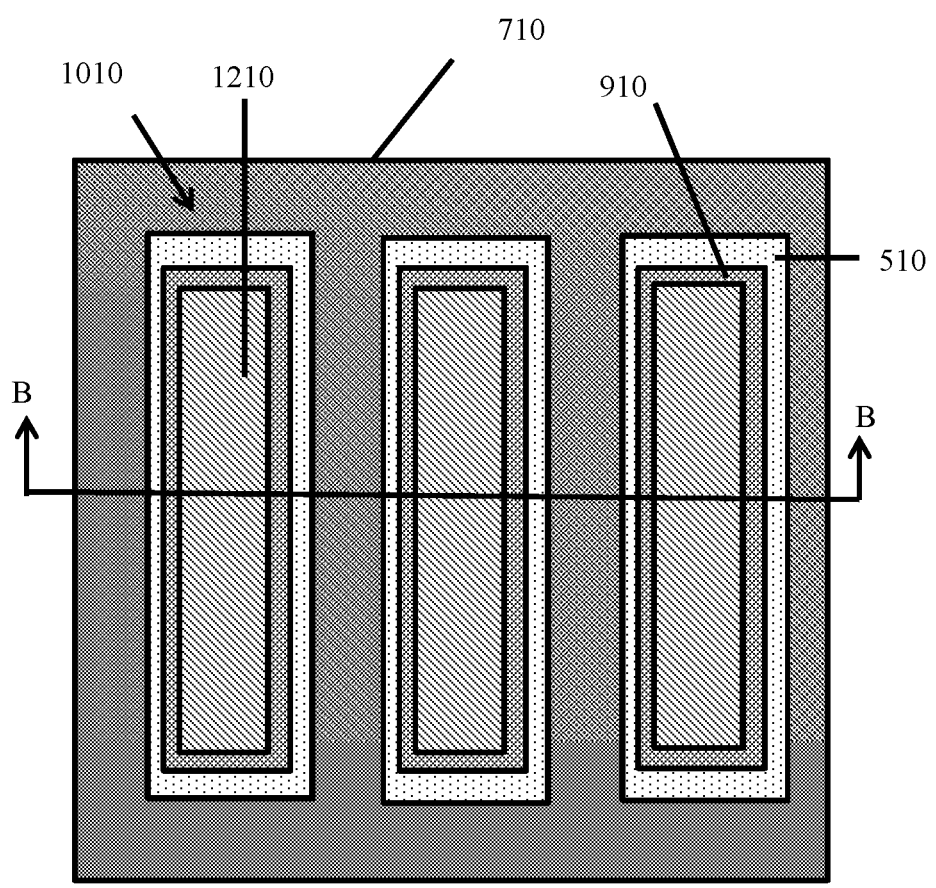
FIG. 21 illustrates a top view following the formation of replacement gate stacks.
Figure 22:
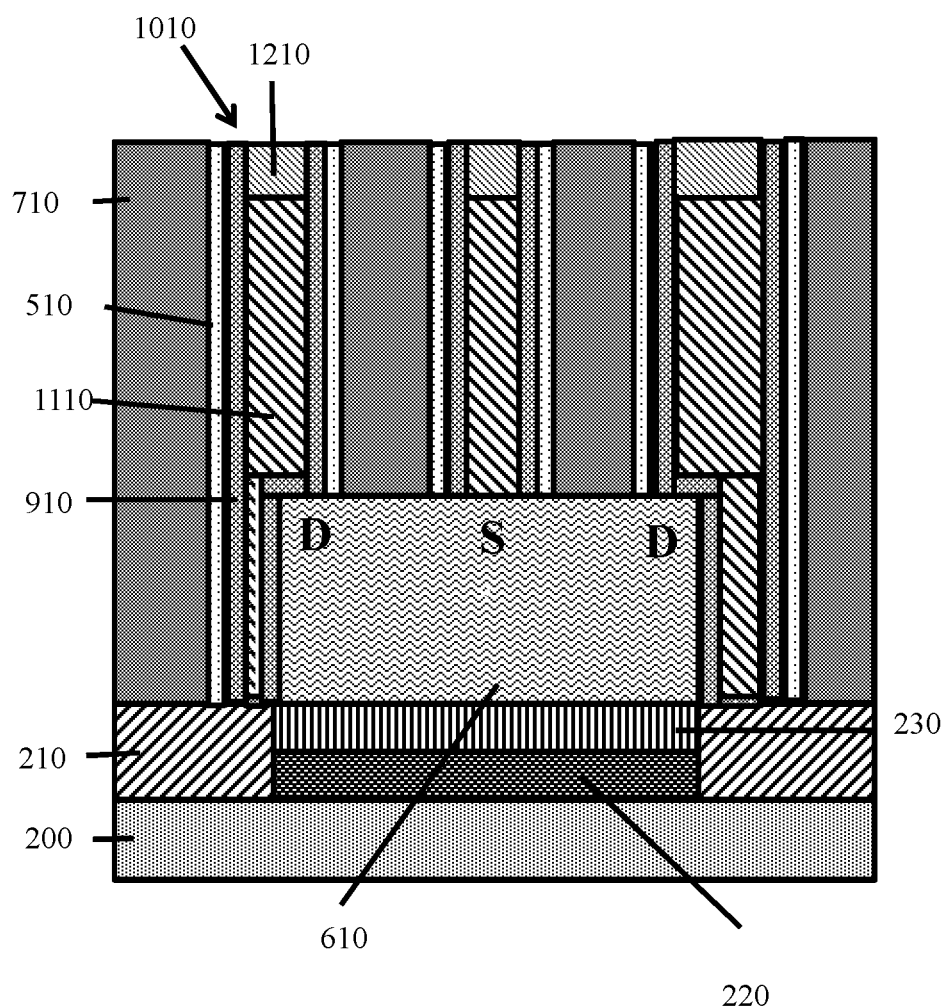
FIG. 22 illustrates a cutaway view along the line B-B of FIG. 21 showing the replacement gate stacks.

FIG. 21 illustrates a top view following the formation of replacement gate stacks 1010. FIG. 22 illustrates a cutaway view along the line B-B of FIG. 21 showing the replacement gate stacks 1010. The replacement gate stacks 1010 of the illustrated embodiment include a work function metal 1110 and a conductive metal 1210. The work function metal(s) 1110 may be disposed over the high-k dielectric material 910. The type of work function metal(s) 1110 depends on the type of transistor and may differ between an NFET and a PFET. Non-limiting examples of suitable work function metals 1110 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal 1210 is deposited over the high-k dielectric material(s) 910 and work function metal(s) 1110 to form the gate stacks. Non-limiting examples of suitable conductive metals 1210 include aluminum (Al), platinum (Pt), gold (Au), tungsten (W), titanium (Ti), titanium nitride (TiN), tantalum nitride (TaN) or any combination thereof. The conductive metal may be deposited by a suitable deposition process, for example, CVD, PECVD, PVD, plating, thermal or e-beam evaporation, and sputtering.

A planarization process, for example, chemical mechanical polishing (CMP), is performed to polish the surface of the conductive gate metal.

The structure shown in FIG. 22 can be further processed for forming transistors or any other electronic devices.

Though the illustrated embodiments include a test structure with devices that include active regions formed from fins, alternate embodiments may include active regions with any suitable geometries, including other types of multi-gate devices, nanowire, and other types of gate-all-around devices that include evenly spaced gates having different thicknesses of dielectric materials and different gate widths.

As used herein, the terms "invention" or "present invention" are non-limiting terms and not intended to refer to any single aspect of the particular invention but encompass all possible aspects as described in the specification and the claims.

While typical embodiments have been set forth for the purpose of illustration, the foregoing descriptions should not be deemed to be a limitation on the scope herein. Accordingly, various modifications, adaptations, and alternatives can occur to one skilled in the art without departing from the spirit and scope herein.

What is claimed is:

1. A method of forming a semiconductor device, the method comprising:
    providing a patterned structure comprising a silicon substrate and dielectric stacks deposited on the silicon substrate, the dielectric stacks forming trenches exposing a plurality of surface portions of the substrate within the trenches;
    determining a lattice constant of the silicon substrate and a lattice constant of a semiconductor material;
    forming one or more epitaxial buffer layers within the trenches on the exposed surface portions of the substrate; and
    growing the semiconductor material within the trenches on the epitaxial buffer layer that is the furthest away from the substrate;
    wherein each of the one or more epitaxial buffer layers and the semiconductor material has less than about 3% lattice mismatch to the layer immediately beneath the one or more epitaxial buffer layer and the semiconductor material.

2. The method of claim 1, further comprising:
    providing a silicon substrate having a dielectric layer on a surface of the substrate; and
    forming trenches within the dielectric layer to expose a plurality of surface portions of the substrate within the trenches to provide the pattern structure.

3. The method of claim 1, wherein the trenches have a selected aspect ratio to reduce defects caused by lattice mismatch between adjacent layers inside the trenches.

4. The method of claim 1, wherein each of the one or more epitaxial buffer layers and the semiconductor material has less than about 2.5% lattice mismatch to the layer immediately beneath the one or more epitaxial buffer layer and the semiconductor material.

5. The method of claim 1, wherein each of the one or more epitaxial buffer layers has a thickness of about 1 nm to about 200 nm.

6. The method of claim 1, wherein the semiconductor material comprises InGaAs, InP, GaAs, GaN, GaP, GaSb, AlGaAs, AlInGaAs, GaInP, or combinations thereof.

7. The method of claim 1, wherein the one or more epitaxial buffer layers comprise a first epitaxial buffer layer deposited on the exposed portions of the silicon substrate, the first epitaxial buffer layer comprising AlAs, GaAs, AlP, GaP, or combinations thereof.

8. The method of claim 7, wherein the one or more epitaxial buffer layers further comprise a second epitaxial buffer layer deposited on the first epitaxial buffer layer, the second buffer layer comprising $In_xAl_{1-x}As$, wherein x is about 0.1 to about 0.7.

9. The method of claim 7, wherein the one or more epitaxial buffer layers further comprise a second epitaxial buffer layer deposited on the first epitaxial buffer layer, the second buffer layer comprising $In_xGa_{1-x}As$, wherein x is 0 to about 0.5.

10. A method for fabricating a semiconductor device, the method comprising:
    providing a patterned structure comprising a silicon substrate and dielectric stacks deposited on the silicon substrate, the dielectric stacks forming trenches exposing a plurality of surface portions of the substrate within the trenches;
    determining a lattice constant of the silicon substrate and a lattice constant of a semiconductor material;
    forming one or more epitaxial buffer layers within the trenches on the exposed surface portions of the substrate;
    growing the semiconductor material within the trenches on the epitaxial buffer layer that is the furthest away from the substrate; each of the one or more epitaxial buffer layers and the semiconductor material having less than about 3% lattice mismatch to the layer immediately beneath the one or more epitaxial buffer layer and the semiconductor material;

forming a fin on the substrate;
forming a sacrificial gate stack over the fin;
forming source/drain regions on the fin;
depositing an insulator layer over the source/drain regions, on the dielectric stacks, and adjacent to the sacrificial gate stack;
removing the sacrificial gate stack to define a cavity; and
forming a metal gate in the cavity.

11. The method of claim 10, further comprising forming spacers adjacent to the sacrificial gate stack prior to forming the source/drain regions.

12. The method of claim 10, wherein each of the one or more epitaxial buffer layers and the semiconductor material has less than about 2.5% lattice mismatch to the layer immediately beneath the one or more epitaxial buffer layer and the semiconductor material.

13. A semiconductor device comprising:
a silicon substrate;
dielectric stacks deposited on the silicon substrate, the dielectric stacks forming trenches exposing a plurality of surface portions of the substrate within the trenches;
one or more epitaxial buffer layers deposited on the exposed surface portions of the substrate within the trenches; and
a semiconductor material deposited within the trenches on the epitaxial buffer layer that is the furthest away from the substrate;
wherein each of the one or more epitaxial buffer layers and the semiconductor material has less than about 3% lattice mismatch to the layer immediately beneath the one or more epitaxial buffer layer and the semiconductor material.

14. The semiconductor device of claim 13, wherein the trenches have a selected aspect ratio to reduce defects caused by lattice mismatch between adjacent layers inside the trenches.

15. The semiconductor device of claim 13, wherein each of the one or more epitaxial buffer layers and the semiconductor material has less than about 2.5% lattice mismatch to the layer immediately beneath the one or more epitaxial buffer layer and the semiconductor material.

16. The semiconductor device of claim 13, wherein each of the one or more epitaxial buffer layers has a thickness of about 1 nm to about 200 nm.

17. The semiconductor device of claim 13, wherein the semiconductor material comprises InGaAs, InP, GaAs, GaN, GaP, GaSb, AlGaAs, AlInGaAs, GaInP, or combinations thereof.

18. The semiconductor device of claim 13, wherein the one or more epitaxial buffer layers comprise a first epitaxial buffer layer deposited on the exposed portions of the silicon substrate, the first epitaxial buffer layer comprising AlAs, GaAs, AlP, GaP, or combinations thereof.

19. The semiconductor device of claim 18, wherein the one or more epitaxial buffer layers further comprise a second epitaxial buffer layer deposited on the first epitaxial buffer layer, the second buffer layer comprising $In_xAl_{1-x}As$, wherein x is about 0.1 to about 0.7.

20. The semiconductor device of claim 18, wherein the one or more epitaxial buffer layers further comprise a second epitaxial buffer layer deposited on the first epitaxial buffer layer, the second buffer layer comprising $In_xGa_{1-x}As$, wherein x is 0 to about 0.5.

* * * * *